United States Patent
Ikeda et al.

(10) Patent No.: US 12,380,836 B2
(45) Date of Patent: Aug. 5, 2025

(54) DISPLAY DEVICE

(71) Applicant: Magnolia White Corporation, Tokyo (JP)

(72) Inventors: Masanobu Ikeda, Tokyo (JP); Yoshinori Aoki, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 66 days.

(21) Appl. No.: 18/353,888

(22) Filed: Jul. 18, 2023

(65) Prior Publication Data

US 2023/0360594 A1  Nov. 9, 2023

Related U.S. Application Data

(63) Continuation of application No. PCT/JP2021/045002, filed on Dec. 7, 2021.

(30) Foreign Application Priority Data

Feb. 4, 2021 (JP) .................... 2021-016809

(51) Int. Cl.
*G09G 3/20* (2006.01)
*G09G 3/32* (2016.01)

(52) U.S. Cl.
CPC ............. *G09G 3/32* (2013.01); *G09G 3/204* (2013.01); *G09G 3/2074* (2013.01); *G09G 3/2077* (2013.01); *G09G 2300/0443* (2013.01); *G09G 2300/0452* (2013.01); *G09G 2360/144* (2013.01); *G09G 2360/16* (2013.01)

(58) Field of Classification Search
CPC ........ G09G 3/32; G09G 3/204; G09G 3/2074; G09G 3/2077; G09G 2300/0443; G09G 2300/0452; G09G 2360/144; G09G 2360/16; G09G 2310/0251; G09G 3/3233; G09F 9/00; G09F 9/302; G09F 9/33; H01L 33/00

See application file for complete search history.

(56) References Cited

U.S. PATENT DOCUMENTS

| | | | | |
|---|---|---|---|---|
| 2007/0279344 A1* | 12/2007 | Kimura | ................ | G09G 3/2022 345/77 |
| 2019/0129209 A1* | 5/2019 | Kobayashi | .......... | G09G 3/3607 |
| 2020/0111403 A1 | 4/2020 | Kim et al. | | |

OTHER PUBLICATIONS

International Search Report and Written Opinion mailed on Feb. 15, 2022, received for PCT Application PCT/JP2021/045002, filed on Dec. 7, 2021, 8 pages including English Translation.

* cited by examiner

*Primary Examiner* — Adam R. Giesy
(74) *Attorney, Agent, or Firm* — XSENSUS LLP

(57) ABSTRACT

A display device includes a display area including a plurality of pixels, and a gradation control circuit configured to control a gradation of the pixel based on a gradation control mode. Each of the plurality of pixels includes first and second LED chips. One frame period of the gradation control mode includes a first to third subframe periods. In the first subframe period, the gradation of the pixel is controlled by a light emitting area of each of the first and second LED chips. In the second subframe period, the gradation of the pixel is controlled by a light emission time of each of the first and second LED chips. In the third subframe period, the gradation of the pixel is controlled by a current value supplied to each of the first and second LED chips.

13 Claims, 11 Drawing Sheets

DISPLAY DEVICE

CROSS-REFERENCE TO RELATED APPLICATIONS

This application is a Continuation of International Patent Application No. PCT/JP2021/045002, filed on Dec. 7, 2021, which claims the benefit of priority to Japanese Patent Application No. 2021-016809, filed on Feb. 4, 2021, the entire contents of which are incorporated herein by reference.

FIELD

An embodiment of the present invention relates to a display device.

BACKGROUND

In a small or medium-sized display device such as a smart phone, a display using liquid crystals or OLEDs (Organic Light Emitting Diodes) has been commercialized. In particular, an OLED display device using the OLEDs which are self-light emitting elements has the advantages of high-contrast and does not require a backlight, as compared with a liquid crystal display device. However, since the OLEDs are composed of organic compounds, it is difficult to secure high reliability of the OLED display device due to deterioration of the organic compounds.

In recent years, a so-called micro LED display device and a mini LED display device in which minute LED chips are mounted in pixels of a circuit substrate have been developed as next-generation display devices (for example, see U.S. Patent Application Publication No. 2020/0111403). The LED is a self-light emitting element similar to the OLED, but unlike OLED, the LED is composed of stable inorganic compounds containing gallium (Ga) or indium (In), and therefore, the micro LED display device has high reliability as compared with the OLED display device. In addition, the LED has high light emission efficiency and high brightness can be realized. Therefore, the micro LED display device is expected to be a next-generation display with high reliability, high brightness, and high contrast.

SUMMARY

A display device according to an embodiment of the present invention includes a display area including a pixel and a gradation control circuit configured to control a gradation of the pixel. The pixel includes a first LED chip and a second LED chip. The gradation control circuit controls the gradation of the pixel based on a gradation control mode. One frame period of the gradation control mode includes a first subframe period, a second subframe period, and a third subframe period. In the first subframe period, the gradation of the pixel is controlled by a light emitting area of each of the first LED chip and the second LED chip. In the second subframe period, the gradation of the pixel is controlled by a light emission time of each of the first LED chip and the second LED chip. In the third subframe period, the gradation of the pixel is controlled by a current value supplied to each of the first LED chip and the second LED chip.

A display device according to an embodiment of the present invention includes a display area including a pixel, an illuminance detection portion configured to detect an illuminance value of an external light, and a gradation control circuit configured to select one of a first gradation control mode, a second gradation control mode, and a third gradation control mode based on the illuminance value. The pixel includes a first LED chip and a second LED chip. One frame period of the first gradation control mode includes a first subframe period and a second subframe period. One frame period of the second gradation control mode includes a third subframe period, a fourth subframe period, and a fifth subframe period. One frame period of the third gradation control mode includes a sixth subframe period, a seventh subframe period, and an eighth subframe period. A gradation of the pixel is controlled by a light emitting area of each of the first LED chip and the second LED chip in the first subframe period, the third subframe period, and the sixth subframe period. The gradation of the pixel is controlled by a light emission time of each of the first LED chip and the second LED chip in the second subframe period, the fourth subframe period, and the seventh subframe period. The gradation of the pixel is controlled by a current value supplied to each of the first LED chip and the second LED chip in the fifth subframe period and the eighth subframe period.

DESCRIPTION OF EMBODIMENTS

Figure 1:
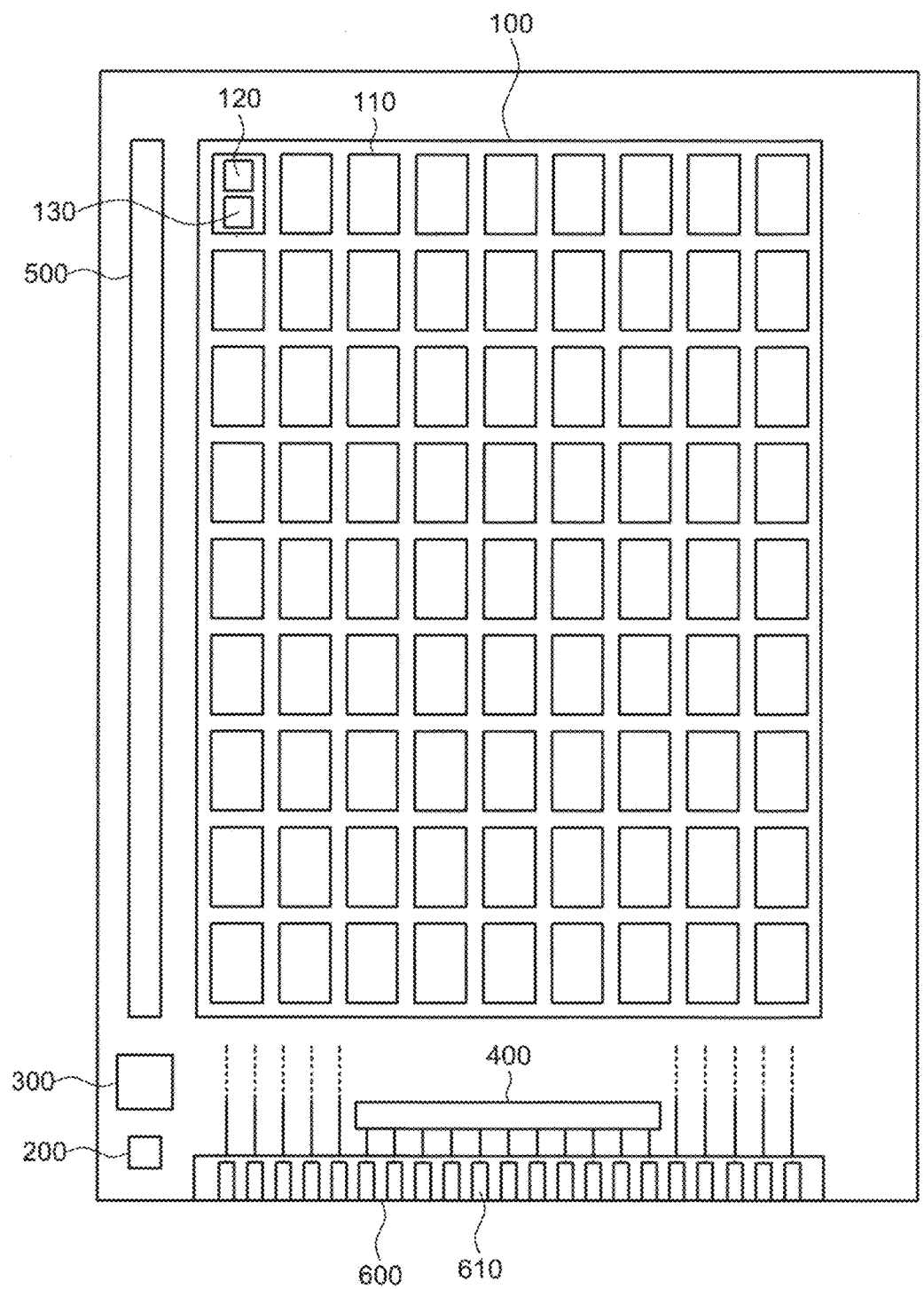
FIG. 1 is a schematic diagram showing a planar layout configuration of a display device according to an embodiment of the present invention.

It is known that an LED chip changes an emission wavelength depending on a current value supplied to the LED chip. In particular, the change in the emission wavelength is remarkable in the LED chip using GaN. Therefore, U.S. Patent Application Publication No. 2020/0111403 describes a method for driving an LED chip by a pulse width modulation (PWM) control method in addition to a current control method in order to reduce the change in the emission wavelength. When the number of gradations increases in the PWM control method, it is necessary to increase the number of pulse widths. However, an increase in the number of pulse widths leads to an increase in the number of scans in one frame period, which is difficult and may limit the number of gradations.

Further, the image quality required for the display of the display device depends on the illuminance value of the external light. For example, when the illuminance value of the external light is small, the brightness of the display may be low. However, it is required to reduce the shift of the emission wavelength. On the other hand, when the illuminance value of the external light is high, high brightness of the display is required rather than the emission wavelength shift.

In view of the above problem, it is one object of an embodiment of the present invention to provide a display device capable of controlling a gradation of a pixel according to an illuminance value of an external light.

Hereinafter, embodiments of the present invention are described with reference to the drawings. Each of the embodiments is merely an example, and a person skilled in the art could easily conceive of the invention by appropriately changing the embodiment while maintaining the gist of the invention, and such changes are naturally included in the scope of the invention. For the sake of clarity of the description, the drawings may be schematically represented with respect to the widths, thicknesses, shapes, and the like of the respective portions in comparison with actual embodiments. However, the illustrated shapes are merely examples and are not intended to limit the interpretation of the present invention.

In the present specification, the expressions "a includes A, B or C", "a includes any of A, B and C", and "a includes one selected from the group consisting of A, B and C" do not exclude the case where a includes a plurality of combinations of A to C unless otherwise specified. Further, these expressions do not exclude the case where a includes other elements.

In the present specification, although the phrase "above" or "above direction" or "below" or "below direction" is used for convenience of explanation, in principle, the direction from a substrate toward a structure is referred to as "above" or "above direction" with reference to a substrate in which the structure is formed. Conversely, the direction from the structure to the substrate is referred to as "below" or "below direction". Therefore, in the expression of a light emitting element over a substrate, one surface of the light emitting element in the direction facing the substrate is the bottom surface of the light emitting element and the other surface is the upper surface of the light emitting element. In addition, the expression of a light emitting element over a substrate only explains the vertical relationship between the substrate and the light emitting element, and another member may be placed between the substrate and the light emitting element. Furthermore, the terms "above" or "above direction" or "below" or "below direction" mean the order of stacked layers in the structure in which a plurality of layers are stacked, and may not be related to the position in which layers overlap in a plan view.

In the specification, terms such as "first", "second", or "third" attached to each configuration are convenient marks used to distinguish each configuration, and have no further meaning unless otherwise explained.

In the specification and drawings, the same reference numeral may be used to indicate multiple identical or similar configurations and the reference numerals with lowercase or uppercase alphabetical letters may be used to distinguish between the multiple configurations. Further, the reference numerals with a hyphen and a natural number may be used to distinguish multi parts in one configuration.

In this specification, "display device" is intended to include a wide range of devices that display a still image or moving images using the light emitting element, and may include not only a display panel and a display module but also a device to which other optical members (for example, a polarizing member, a backlight, a touch panel, or a biological authentication sensor, etc.) are attached.

The following embodiments can be combined with each other as long as there is no technical contradiction.

First Embodiment

A display device 10 according to an embodiment of the present invention is described with reference to FIGS. 1 to 8.

[1. Overview of Configuration of Display Device 10]

FIG. 1 is a schematic plan view showing a planar layout configuration of the display device 10 according to an embodiment of the present invention.

As shown in FIG. 1, the display device 10 includes a display area 100, an illuminance detection portion 200, a gradation control circuit 300, a video signal line drive circuit 400, a scanning signal line drive circuit 500, and a terminal portion 600. The illuminance detection portion 200, the gradation control circuit 300, the video signal line drive circuit 400, the scanning signal line drive circuit 500, and the terminal portion 600 are provided around the display area 100. In addition, the area around the display area 100 may be referred as a non-display area, a frame area, or the like.

The display area 100 can display images. The display area 100 includes a plurality of pixels 110. Although the plurality of pixels 110 are arranged, for example, in a matrix, the arrangement of the plurality of pixels 110 is not limited to this configuration. Each of the plurality of pixels 110 includes a first LED chip 120, a second LED chip 130, and a transistor 140. The details of the structures of the first LED chip 120, the second LED chip 130, and the transistor 140 are described later.

The first LED chip 120 and the second LED chip 130 have the same emission color. Each of the first LED chip 120 and the second LED chip 130 is either one of a red LED chip, a green LED chip, and a blue LED chip. That is, each of the plurality of pixels 110 has one emission color of red emission, green emission, and blue emission. The display area 100 can display a full-color image by controlling the emission color and gradation in each of the plurality of pixels 110.

The size of the first LED chip 120 and second LED chip 130 are not particularly limited. The size of the first LED chip 120 and the second LED chip 130 may be determined depending on the size or resolution of the display device 10. For example, when the display device 10 is a small-to-medium display device, a mini LED chip or a micro LED chip can be used as the first LED chip 120 and second LED chip 130.

The first LED chip 120 and the second LED chip 130 may be LED chips of the same size or LED chips of different sizes. In addition, hereinafter, the first LED chip 120 and the second LED chip 130 are described as LED chips having the same size, for convenience.

The illuminance detection portion 200 can detect an illuminance value of external light. For example, the illuminance detection portion 200 is an illuminance sensor.

The gradation control circuit 300 can determine the illuminance value to select a gradation control mode. Further, the gradation control circuit 300 can generate a signal for controlling the pixel 110 according to the selected gradation control mode.

The video signal line driving circuit 400 and the scanning signal line driving circuit 500 can drive the transistor 140 included in the pixel 110 to control light emission or non-light emission of the first LED chip 120 and the second LED chip 130.

The terminal portion 600 includes a plurality of terminals 610 and can be electrically connected to an external device. That is, the display device 10 can be supplied with power or signals from the external device via the terminal portion 600.

Figure 2:
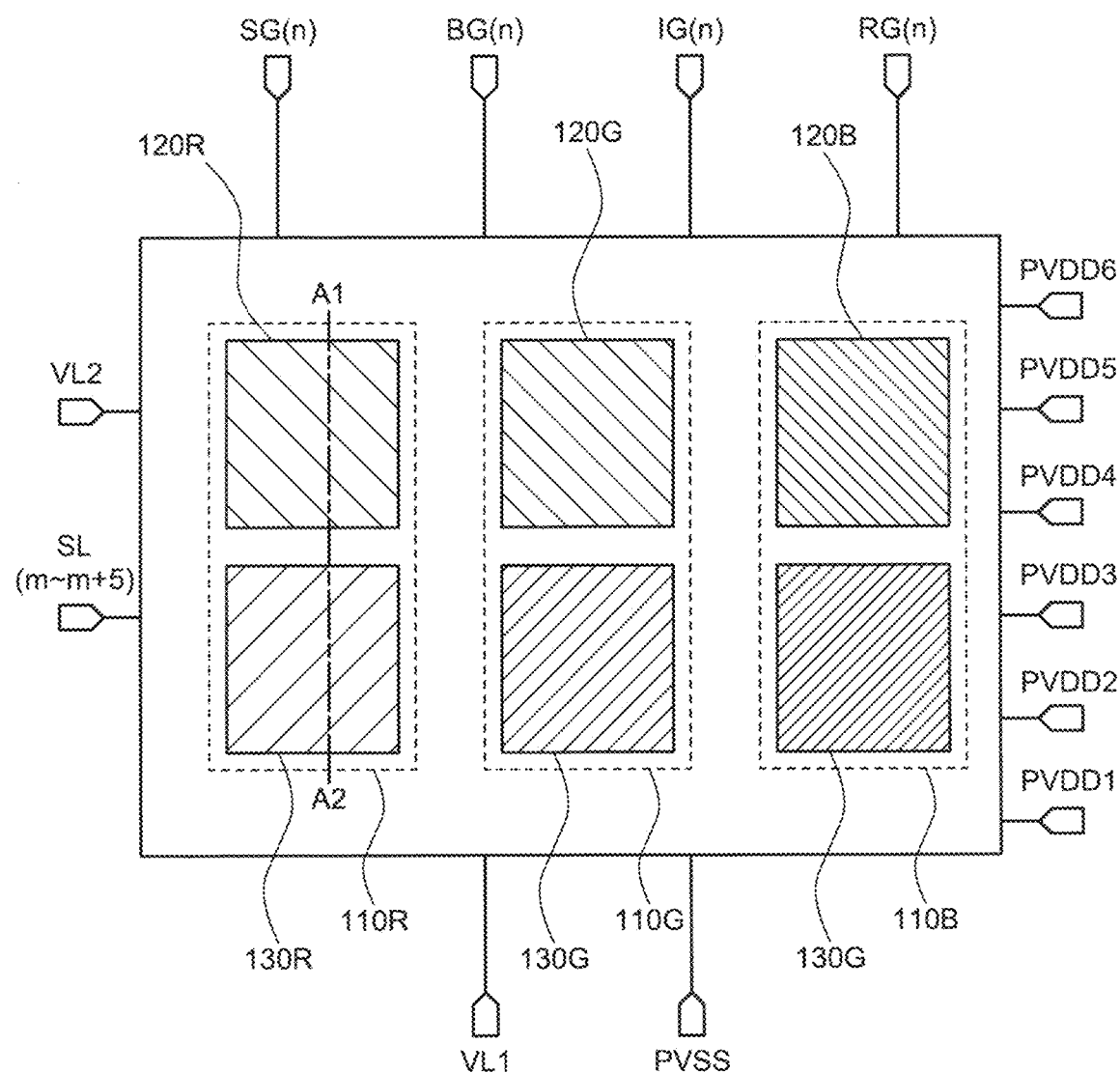
FIG. 2 is a schematic plan view showing a pixel configuration of a display device according to an embodiment of the present invention.

FIG. 2 is a schematic plan view showing a pixel configuration of the pixel 110 of the display device 10 according to an embodiment of the present invention. FIG. 2 shows a pixel unit including a red pixel 110R, a green pixel 110G, and a blue pixel 110б.

As shown in FIG. 2, the red pixel 110R includes a first red LED chip 120R and a second red LED chip 130R. The green pixel 110G includes a first green LED chip 120G and a second green LED chip 130G. The blue pixel 110б includes a first blue LED chip 120B and a second blue LED chip 130B. In addition, hereinafter, when colors of a pixel, a first LED chip, and a second LED chip are not particularly distinguished, the pixel, the first LED chip, and the second LED chip may be referred to as the pixel 110, the first LED chip 120, and the second LED chip 130.

The scanning signal line drive circuit 500 can commonly supply a scanning signal SG(n), a light emission control signal BG(n), an initialization control signal IG(n), and a first reset signal RG(n) to the pixel units located in the n-th row in the display area 100 (n is an integer greater than or equal to 1). The first rest signal RG(n) can supply a voltage Vrst to the pixel units located in the n-th row in the display area 100. A reference voltage line PVSS can commonly supply a reference voltage VSS to the pixel units. A reset signal VL1 can commonly supply the voltage Vrst to the pixel units.

The video signal line drive circuit 400 can commonly supply a video signal SL(m) and a second reset signal VL2 to the pixel units located in the m-th column in the display area 100 (m is an integer greater than or equal to 1). The second reset signal VL2 can supply a voltage Vini to the pixel units located in the m-th column in the display area 100. A first drive power supply line PVDD1 can supply a first drive voltage VDDH1 to the pixel units located in the m-th column in the display area 100. A second drive power supply line PVDD2 can supply a second drive voltage VDDH2 to the pixel units located in the m-th column in the display area 100. A third drive power supply line PVDD3 can supply a third drive voltage VDDH3 to the pixel units located in the m-th column in the display area 100. A fourth drive power supply line PVDD4 can supply a fourth drive voltage VDDH4 to the pixel units located in the m-th column in the display area 100. A fifth drive power supply line PVDD5 can supply a fifth drive voltage VDDH5 to the pixel units located in the m-th column in the display area 100. A sixth drive power supply line PVDD6 can supply a sixth drive voltage VDDH6 to the pixel units located in the m-th column in the display area 100.

Although an example in which the voltage Vrst and the voltage Vini are fixed voltages is shown in the specification, the voltage Vrst and the voltage Vini may be voltages that change over time. In the specification, although the scanning signal line driver circuit 500 supplies the first reset signal RG to the pixel units and the video signal line driver circuit 400 supplies the second reset signal VL2 to the pixel units, the pixel configuration is not limited to this configuration. The video signal line drive circuit 400 may supply the first reset signal RG to the pixel units and the scanning signal line drive circuit 500 may supply the second reset signal VL2 to the pixel units. Further, either one of the scanning signal line drive circuit 500 and the video signal line drive circuit 400 may supply the first reset signal RG and the second reset signal VL2 to the pixel units. Furthermore, the first reset signal RG and the second reset signal VL2 may be electrically connected to the terminals 610. In this case, the voltage Vrst and the voltage Vini are supplied from the external device. In the specification, the voltage Vrst may be referred to as a reset voltage. Further, in the specification, the voltage Vini may be referred to as an initialization voltage.

In the specification, although the first drive power supply line PVDD1, the second drive power supply line PVDD2, the third drive power supply line PVDD3, the fourth drive power supply line PVDD4, the fifth drive power supply line PVDD5, and the sixth drive power supply line PVDD6 are provided in the video signal line drive circuit 400 and the first drive voltage VDDH1, the second drive voltage VDDH2, the third drive voltage VDDH3, the fourth drive voltage VDDH4, the fifth drive voltage VDDH5, and the sixth drive voltage VDDH6 are supplied from the video signal line drive circuit 400 to the pixel units, the pixel configuration is not limited to this configuration. The first drive power supply line PVDD1, the second drive power supply line PVDD2, the third drive power supply line PVDD3, the fourth drive power supply line PVDD4, the fifth drive power supply line PVDD5, and the sixth drive power supply line PVDD6 may be provided in the scanning signal line driving circuit portion 500. Further, part of voltages of the first driving voltage VDDH1, the second driving voltage VDDH2, the third driving voltage VDDH3, the fourth driving voltage VDDH4, the fifth driving voltage VDDH5, and the sixth driving voltage VDDH6 may be provided in the scanning signal line drive circuit 500 and the rest voltages may be provided in the video signal line drive circuit 400. In the display device 10 according to the present embodiment, the arrangement of the power supply lines may be appropriately changed according to the application or specifications of the display device 10.

[2. Structure of Pixel 110]

Figure 3:
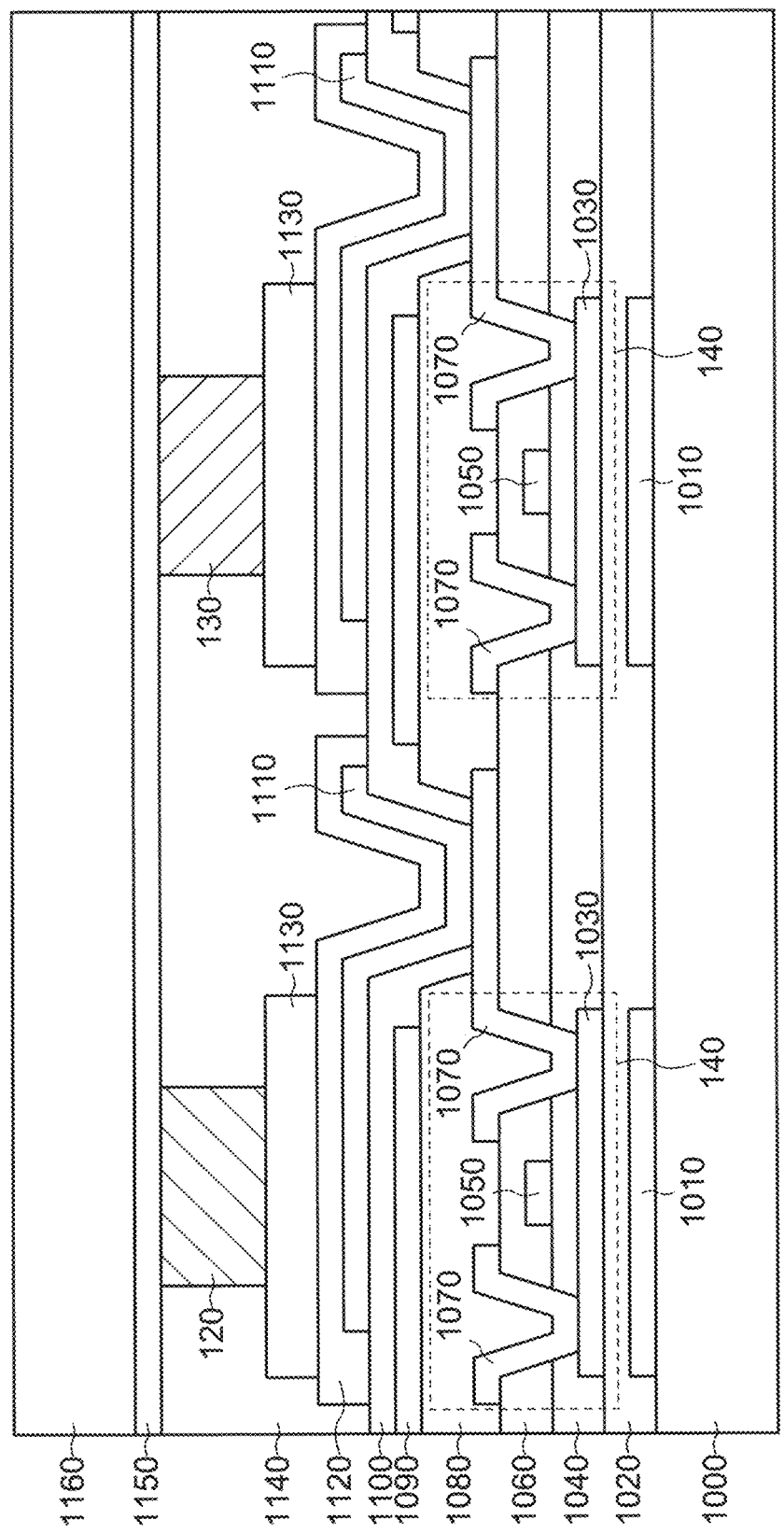
FIG. 3 is a schematic cross-sectional view of a pixel of a display device according to an embodiment of the invention.

FIG. 3 is a schematic cross-sectional view of the pixel 110 of the display device 10 according to an embodiment of the present invention. Specifically, FIG. 3 is a schematic cross-sectional view of the pixel 110 cut along the line A1-A2 shown in FIG. 2.

As shown in FIG. 3, the pixel 110 includes a substrate 1000, a light shielding layer 1010, an undercoat layer 1020, a semiconductor layer 1030, a first insulating layer 1040, a first conductive layer 1050, a second insulating layer 1060, a second conductive layer 1070, a first planarization layer 1080, a third conductive layer 1090, a third insulating layer 1100, a fourth conductive layer 1110, a fifth conductive layer 1120, a sixth conductive layer 1130, a first LED chip 120, a second LED chip 130, a second planarization layer 1140, a seventh conductive layer 1150, and an overcoat layer 1160.

The substrate 1000 can support each layer provided over the substrate 1000. The substrate 1000 may be a substrate that can transmit light emitted from the first LED chip 120 or the second LED chip 130. For example, a light-transmitting rigid substrate such as a glass substrate, a quartz substrate, or a sapphire substrate can be used as the substrate 1000. Further, a non-light-transmitting rigid substrate such as a silicon substrate can be used as the substrate 1000. A light-transmitting flexible substrate such as a polyimide resin substrate, an acrylic resin substrate, a siloxane resin substrate, or a fluororesin substrate can be used as the substrate 1000. In order to improve the heat resistance of the substrate 1000, impurities may be introduced into the above resin substrate. In addition, a substrate in which a silicon oxide film or a silicon nitride film is formed over the rigid substrate or the flexible substrate described above can also be used as the substrate 1000.

The light shielding layer 1010 can reflect or absorb external light. For example, aluminum (Al), copper (Cu), titanium (Ti), molybdenum (Mo), tungsten (W), alloys or compounds thereof, or the like can be used as a material of the light shielding layer 1010. Further, for example, a black matrix can be used as a material of the light shielding layer 1010. Furthermore, the light shielding layer 1010 may have a stacked structure as well as a single layer structure. For example, the light shielding layer 1010 may have a stacked structure of a red color filter, a green color filter, and a blue color filter.

The undercoat layer 1020 can prevent impurities from diffusing into the semiconductor layer 1030. For example, silicon oxide or silicon nitride can be used as a material of the undercoat layer 1020. Further, the undercoat layer 1020 may be a single layer or a stacked layer. In addition, a configuration in which the undercoat layer 1020 is not provided may also be adopted.

The configuration of a so-called transistor 140 is adopted in the semiconductor layer 1030, the first insulating layer 1040, the first conductive layer 1050, the second insulating layer 1060, and the second conductive layer 1070. That is, the semiconductor layer 1030, the first insulating layer 1040, the first conductive layer 1050, the second insulating layer 1060, and the second conductive layer 1070 can respectively function as a semiconductor film, a gate insulating film, a gate electrode, an interlayer insulating layer, and a source or drain electrode.

The transistor 140 shown in FIG. 3 is a top-gate transistor. The first insulating layer 1040 (the gate insulating film) is provided on the semiconductor layer 1030 (the semiconductor film). The first conductive layer 1050 (the gate electrode) is provided on the first insulating layer 1040 (the gate insulating film). The second insulating layer 1060 (the interlayer insulating film) is provided on the first conductive layer 1050 (the gate electrode). The second conductive layer 1070 (the source electrode or the drain electrode) is provided on the second insulating layer 1060 (the interlayer insulating film). An opening is provided in the first insulating layer 1040 (the gate insulating film) and the second insulating layer 1060 (the interlayer insulating film). The second conductive layer 1070 (the source electrode or the drain electrode) is electrically connected to the semiconductor layer 1030 (the semiconductor film) through the opening. In addition, the transistor 140 included in the pixel 110 is not limited to the top-gate transistor. The transistor 140 may be a bottom-gate transistor. Further, a dual-gate transistor may be used in which two gate electrodes with insulating layers provided on and under the semiconductor layer 1030 interposed therebetween are included. In the case of the dual-gate transistor, for example, the first conductive layer 1050 is used as the first gate electrode, and the light blocking layer 1010 is used as the second gate electrode.

A semiconductor material capable of forming a channel region can be used as a material of the semiconductor layer 1030. For example, silicon, an oxide semiconductor such as indium gallium zinc oxide (IGZO) or zinc oxide (ZnO), or a compound semiconductor such as gallium arsenide (GaAs) or gallium nitride (GaN) can be used as the semiconductor material. When the semiconductor material is silicon, the semiconductor material may be amorphous silicon, polysilicon, or single crystal silicon. The semiconductor layer 1030 may include not only the channel region but also a source region or a drain region (a high concentration impurity region). Further, a low concentration impurity region may be included between the channel region and the source region or between the channel region and the drain region.

For example, silicon oxide, silicon nitride, aluminum oxide, hafnium oxide, aluminum nitride, or the like can be used as a material of each of the first insulating layer 1040 and the second insulating layer 1060. Further, the first insulating layer 1040 or the second insulating layer 1060 may be a single layer or a stacked layer.

A metal material can be used as a material of each of the first conductive layer 1050 and the second conductive layer 1070. For example, copper (Cu), aluminum (Al), titanium (Ti), chromium (Cr), cobalt (Co), nickel (Ni), molybdenum (Mo), hafnium (Hf), tantalum (Ta), tungsten (W), or bismuth (Bi), or alloys or compounds thereof can be used as the metal material. Further, the first conductive layer 1050 or the second conductive layer 1070 may be a single layer or a stacked layer.

The first planarization layer 1080 can planarize unevenness of the transistor 140. The first planarization layer 1080 is provided on the second conductive layer 1070. The first planarization layer 1080 may optionally have openings to expose parts of the second conductive layer 1070. For example, an acrylic resin, a silicone resin, a polyimide resin, or the like can be used as a material of the first planarization layer 1080.

The third conductive layer 1090 can function as a common electrode. For example, a transparent conductive material such as indium tin oxide (ITO) or indium zinc oxide (IZO) can be used as a material of the third conductive layer 1090.

The third insulating layer 1100 can function as a capacitor dielectric. For example, silicon nitride or the like can be used as a material of the third insulating layer 1100.

The fourth conductive layer 1110 can function as a pixel electrode. For example, a transparent conductive material such as indium tin oxide (ITO) or indium zinc oxide (IZO) can be used as a material for the fourth conductive layer 1110.

The fifth conductive layer 1120 can function as an anode. For example, a transparent conductive material such as indium tin oxide (ITO) or indium zinc oxide (IZO), or a metal material such as silver (Ag) can be used as a material of the fifth conductive layer 1120. Further, the fifth conductive layer 1120 can also have a stacked structure of these materials. For example, a structure such as ITO/Ag/ITO can be used as the stacked structure.

The sixth conductive layer 1130 can function as a connection layer that connects the electrode provided on the first LED chip 120 or the second LED chip 130 and the fifth conductive layer 1120 provided on the side of the substrate 1000. For example, silver paste or solder can be used as a material of the sixth conductive layer 1130.

The second planarization layer 1140 can planarize unevenness of the first LED chip 120 or the second LED chip 130. For example, an acrylic resin, a polyimide resin, an epoxy resin, a silicone resin, or the like can be used as a material of the second planarization layer 1140.

The seventh conductive layer 1150 can function as a cathode. For example, a transparent conductive material such as indium tin oxide (ITO) or indium zinc oxide (IZO) can be used as a material of the seventh conductive layer 1150.

The overcoat layer 1160 can reduce external influences (moisture, impact, etc.). An inorganic material such as silicon nitride or an organic material such as acrylic resin or polyimide resin can be used as a material of the overcoat layer 1160. Further, the overcoat layer 1160 can also have a stacked structure of these materials.

[4. Circuit Configuration of Pixel 110]

Figure 4:
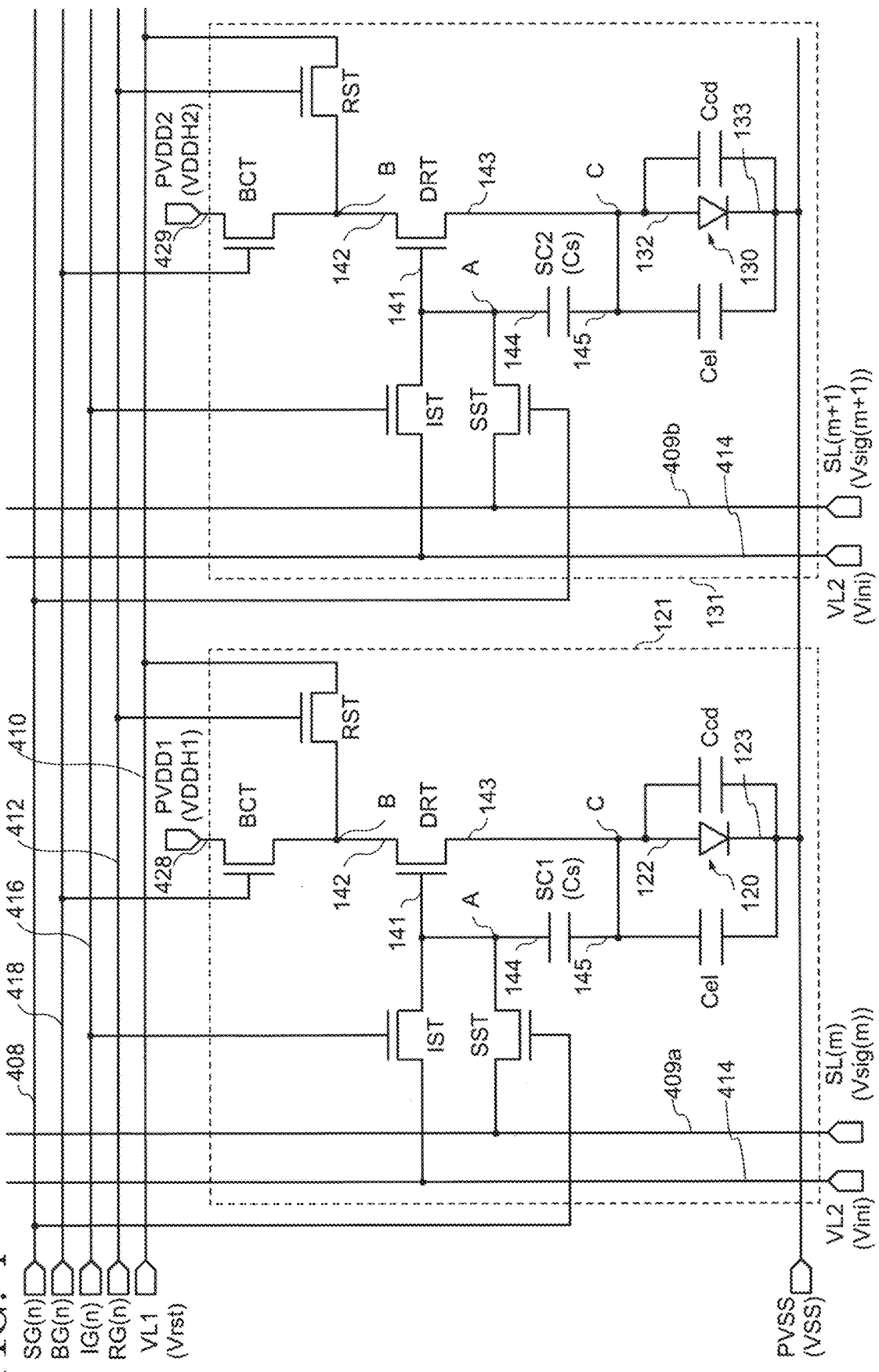
FIG. 4 is a circuit diagram showing a circuit configuration of a pixel of a display device according to an embodiment of the present invention.

FIG. 4 is a circuit diagram showing a circuit configuration of the pixel 110 of the display device 10 according to an embodiment of the present invention.

As shown in FIG. 4, the pixel 110 includes a first drive portion 121 that controls the first LED chip 120 and the second LED chip, and a second drive portion 131. The configuration of the second drive portion 131 differs from the configuration of the first drive portion 120 in that an LED chip is the second LED chip 130, a holding capacitive element is a holding capacitive element SC2, and a drive power line is a second drive power line PVDD2. In other words, the configuration of the second drive portion 131 is the same as the configuration of the first drive portion 121 except for the LED chip, the holding capacitor element, and the drive power line.

As shown in FIG. 4, the first drive portion 121 includes a drive transistor DRT, a selection transistor SST (a first switch), an initialization transistor IST (a second switch), a reset transistor RST (a third switch), a light emission control transistor BCT (a fourth switch), a holding capacitive element SC1 (a capacitive element), the first LED chip 120, a cathode capacitor Ccd, and an additional capacitor Cel. Each of these transistors includes a first electrode (the gate electrode) and a pair of electrodes consisting of a second electrode and a third electrode (the source electrode and the drain electrode). Each of the holding capacitive element SC1, the cathode capacitor Ccd, and the additional capacitor Cel includes a pair of electrodes. In addition, the additional capacitor Cel may be the parasitic capacitance of the first LED chip 120, and may include the capacitive element provided in parallel with the first LED chip 120 and the parasitic capacitance of the first LED chip 120.

For a power source for driving the first LED chip 120 of the first drive portion 121, a first drive voltage VDDH1 is supplied from the first drive power supply line PVDD1, a reference voltage VSS is supplied from the reference voltage line PVSS, and a voltage Vrst is supplied from the reset signal VL1. Further, for a power source for driving the second LED chip 130 of the second drive portion 131, a second drive voltage VDDH2 is supplied from the second drive power supply line PVDD2. The voltage Vrst is lower than the first drive voltage VDDH1 and the second drive voltage VDDH2, and may be substantially the same as the reference voltage VSS. The first drive voltage VDDH1 may be larger than the second drive voltage VDDH2, the third drive voltage VDDH3 may be larger than the fourth drive voltage VDDH4, and the fifth drive voltage VDDH5 may be larger than the six voltage VDDH6.

The drive transistor DRT has a function of flowing a current to the first LED chip 120 using an input video signal to emit light from the first LED chip 120. The selection transistor SST has a function of supplying a video signal to the drive transistor DRT. The initialization transistor IST has a function of supplying a voltage Vini to the first electrode 141 (the gate electrode 141) of the drive transistor DRT and resetting the drive transistor DRT. The light emission control transistor BCT controls connection or disconnection between the first drive power supply line PVDD1 or the second drive power supply line PVDD2 and the drive transistor DRT. The light emission control transistor BCT controls electrical connection or disconnection between the drive transistor DRT and the first LED chip 120 and between the drive transistor DRT and the additional capacitor Cel. That is, the light emission control transistor BCT of the first driving portion 121 has a function of controlling light emission or non-light emission of the first LED chip 120. Further, for a power source for driving the second LED chip 130 of the second drive portion 131, a second drive voltage VDDH2 is supplied from the second drive power supply line PVDD2. That is, the light emission control transistor BCT of the second driving portion 131 has a function of controlling light emission or non-light emission of the second LED chip 130.

The reset transistor RST supplies the voltage Vrst to the third electrode 142 (the drain electrode 142) of the drive transistor DRT, supplies the voltage Vrst to the first electrode 122 of the first LED chip 120, and supplies the voltage Vrst to the second electrode 143 (the source electrode 143) of the drive transistor DRT, and has a function of resetting the first LED chip 120. For example, the first electrode 122 of the first LED chip 120 is an anode. Further, the reset transistor RST of the second driving portion 131 supplies the voltage Vrst to the first electrode 132 of the second LED chip 130 and has the same function as the reset transistor RST of the first driving section 121.

The holding capacitive element SC1 has a function of securing a voltage corresponding to the threshold of the driving transistor DRT. Further, the holding capacitive element SC1 has a function of maintaining the voltage input to the first electrode 141 (the gate electrode 141) of the driving transistor DRT to emit light from the first LED chip 120. That is, the holding capacitive element SC1 has a function of holding the input video signal. Further, the holding capacitive element SC2 has the same configuration and the same function as the holding capacitive element SC1.

Although the display device 10 according to the present embodiment has a holding capacitive element such as the holding capacitive element SC2 or the holding capacitive element SC1 for holding the input video signal, the input video signal may be not held in the holding capacitive element. For example, the element capable of holding a signal or voltage may be an element capable of holding binary data such as SRAM.

The first LED chip 120 has diode characteristics. The additional capacitor Cel corresponds to a capacitance included in the first LED chip 120. The cathode capacitor Ccd corresponds to a capacitance formed between the first electrode 122 of the first LED chip 120 and the reference voltage line PVSS. Further, the second LED chip 130 has diode characteristics similar to the first LED chip 120. The additional capacitor Cel of the second driving section 131 also corresponds to a capacitance included in the second LED chip 130. The cathode capacitor Ccd of the second drive section 131 also corresponds to a capacitance formed between the first electrode 132 of the second LED chip 130 and the reference voltage line PVSS. In the present embodiment, the input video signal may be held by the additional capacitor Cel and the holding capacitive element SC1 or SC2.

The gate electrode of the initialization transistor IST is electrically connected to an initialization control line 416. The initialization control signal IG(n) is supplied to the initialization control line 416. The initialization transistor IST is controlled to be in a conducting state or a non-conducting state by the signal supplied as the initialization control signal IG(n). When the signal supplied as the initialization control signal IG(n) is at a low level (L level), the initialization transistor IST is in the non-conducting state. When the signal supplied to the initialization control signal IG(n) is at a high level (H Level), the initialization transistor IST is in the conducting state. The source electrode of the initialization transistor IST is electrically connected to a second reset voltage line 414. The second reset signal VL2 is supplied to the second reset voltage line 414. The drain electrode of the initialization transistor IST is electrically connected to the gate electrode 141 of the drive transistor DRT, the drain electrode of the select transistor SST, and the first electrode 144 of the holding capacitive element SC1. The second electrode 145 of the holding capacitive element SC1 is electrically connected to the source electrode 143 of the drive transistor DRT, the drain electrode of the reset transistor RST, the first electrode 122 of the first LED chip 120, and the first electrode of the additional capacitor Cel. The second electrode 145 of the holding capacitive element SC2 is electrically connected to the source electrode 143 of the drive transistor DRT of the second drive portion 131, the drain electrode of the reset transistor RST of the second drive portion 131, the first electrode of the second LED chip 130, and the first electrode of the additional capacitor Cel.

The gate electrode of the selection transistor SST is electrically connected to the scanning signal line 408. The scanning signal SG(n) is supplied to the scanning signal line 408. The selection transistor SST is controlled to be in a conducting state or a non-conducting state by the signal supplied to the scanning signal SG(n). When the signal supplied to the scanning signal SG(n) is at the L level, the select transistor SST is in the non-conducting state. When the signal supplied to the scanning signal SG(n) is at the H level, the selection transistor SST is in a conducting state. The source electrode of the selection transistor SST is electrically connected to a video signal line 409. The video signal SL(m) is supplied to the video signal line 409.

The gate electrode of the emission control transistor BCT is electrically connected to the emission control line 418. The light emission control signal BG(n) is supplied to the light emission control line 418. The light emission control transistor BCT is controlled to be in a conducting state or a non-conducting state by the signal supplied as the light emission control signal BG(n). When the signal supplied to the light emission control signal BG(n) is at the L level, the light emission control transistor BCT is in the non-conducting state. When the signal supplied to the light emission control signal BG(n) is at the H level, the light emission control transistor BCT is in the conducting state. The drain electrode of the light emission control transistor BCT is electrically connected to the first drive power supply line PVDD1 or the second drive power supply line PVDD2. The first drive power supply line PVDD1 is a first drive power supply line 428. The second drive power line PVDD2 is a second drive power line 429. The source electrode of the light emission control transistor BCT is electrically connected to the drain electrode 142 of the drive transistor DRT.

The gate electrode of the reset transistor RST is electrically connected to a first reset signal line 412. The first reset signal RG is supplied to the first reset signal line 412. The rest transistor RST is controlled to be in a conducting state or a non-conductive state by the signal supplied to the first reset signal line 412. When the signal supplied to the first reset signal line 412 is at the L level, the reset transistor RST is in the non-conducting state. When the signal supplied to the first reset signal line 412 is at the H level, the reset transistor RST is in the conducting state. The source electrode of the reset transistor RST is electrically connected to a first reset voltage line 410. The first reset signal VL1 is supplied to the first reset voltage line 410.

The second electrode 123 of the first LED chip 120, and the second electrodes of the cathode capacitor Ccd and the additional capacitor Cel are electrically connected to the reference voltage line PVSS. The reference voltage line PVSS is electrically connected to the cathode, for example. In addition, the second electrode 133 of the second LED chip 130, similar to the second electrode 123 of the first LED chip 120, is connected to the reference voltage line PVSS. Further, the second electrodes of the cathode capacitor Ccd and the additional capacitor Cel. are electrically connected to the reference voltage line PVSS.

The drain electrode of the initialization transistor IST, the drain electrode of the select transistor SST, the gate electrode 141 of the drive transistor DRT, and the first electrode 144 of the holding capacitive element SC1 are electrically connected to a first node A. The source electrode 143 of the drive transistor DRT, the second electrode of the storage capacitive element Cs, the first electrode 122 of the first LED chip 120, and the first electrode of the additional capacitor Cel are electrically connected to a third node C. The drain electrode of the reset transistor RST, the drain electrode 142 of the drive transistor DRT, and the source electrode of the light emission control transistor BCT are electrically connected to a second node B.

In the specification, since the first reset voltage line 410 supplies the common voltage Vrst to the pixel 110, the first reset voltage line 410 may be referred to as a second common electrode. Since the second reset voltage line 414 supplies the common voltage Vini to the pixels 110, the second reset voltage line 414 may be referred to as a third common electrode. In addition, the voltage Vrst and the voltage Vini are substantially the same voltage. When the drive transistor is reset, the voltage of the gate electrode 141 of the drive transistor DRT can be substantially identical to the voltage of the source electrode 143 of the drive transistor DRT because the voltage Vrst and the voltage Vini are substantially the same voltage. Therefore, both the reset of the drive transistor DRT and the threshold correction of the drive transistor DRT can be performed with high accuracy.

In the specification, a conducting state indicates a state in which the source electrode and the drain electrode of the transistor are electrically connected to each other and the transistor is in an on-state. Further, in the specification, a non-conducting state indicates a state in which the source electrode and the drain electrode of the transistor are electrically disconnected to each other and the transistor is in an off-state. In addition, the source electrode and the drain electrode may be switched depending on the voltage of each electrode in each transistor. Further, a person skilled in the art can easily understand that a small amount of current such as a leakage current flows even when the transistor is in the off-state.

[5. Control of Gradation of Pixel 110]

In the display device 10 according to the present embodiment, the gradation control circuit 300 selects a gradation control mode to control the gradation of the pixels 110 based on the gradation control mode. The gradation control mode includes multiple control methods for controlling the gradation of the pixels 110. For example, the control methods include an area control method, a pulse width modulation (PWM) control method, or a current control method.

First, the area control method, the PWM control method, and the current control method for controlling the gradation of the pixel 110 of the display device according to the present embodiment are described.

[5-1. Area Control Method]

In the area control method, the gradation of pixels is controlled by the light emitting area of the LED chip. That is, in the display device 10, the gradation of the pixel 110 is controlled by light emission or non-light emission of the first LED chip 120 or the second LED chip 130. For convenience, the following description assumes that the number of gradations is 2 bits.

Light emission control of the first LED chip 120 is assigned for one of the two bits (hereinafter referred to as "0th bit"). That is, in the 0th bit, the gradation of the pixel 110 can be controlled depending on whether the first LED chip 120 emits light or not. Light emission control of both the first LED chip 120 and the second LED chip 130 is assigned for the other bit of the two bits (hereinafter referred to as "1st bit"). That is, in the 1st bit, the gradation of the pixel 110 can be controlled depending on whether both the first LED chip 120 and the second LED chip 130 emit light or not. While only the first LED chip 120 emits light in the 0th bit, both the first LED chip 120 and the second LED chip 130 emit light in the 1st bit. Therefore, when the first LED chip 120 and the second LED chip 130 have the same size and structure (that is, the same LED chip), the light emitting area controlled in the 1st bit is larger than the light emitting area controlled in the 0th bit. Therefore, in the area control method, four gradation levels as shown in Table 1 can be expressed by controlling light emission or non-light emission of the first LED chip 120 or the second LED chip 130.

TABLE 1

| Gradation level | 0th bit | 1st bit |
| --- | --- | --- |
| 0 | First LED chip (non-light emission) | First LED chip (non-light emission) and Second LED chip (non-light emission) |
| 1 | First LED chip (light emission) | First LED chip (non-light emission) and Second LED chip (non-light emission) |
| 2 | First LED chip (non-light emission) | First LED chip (light emission) and Second LED chip (light emission) |
| 3 | First LED chip (light emission) | First LED chip (light emission) and Second LED chip (light emission) |

In the area control method, the voltage applied to the video signal SL(m) is constant, and light emission or non-light emission of the first LED chip 120 or the second LED chip 130 can be controlled by the light emission control transistor BCT.

In the area control method, the number of gradations can be increased by increasing the number of LED chips.

[5-2. PWM Control Method]

In the PWM control method, the gradation of pixels is controlled by a light emission time (a pulse width) of the LED chip. That is, in the display device 10, the gradation of the pixel 110 is controlled by the light emission time of the first LED chip 120 and the second LED chip 130. For convenience, the following description assumes that the number of gradations is 2 bits.

A first pulse width is assigned for one of the two bits (hereinafter referred to as "0th bit"). That is, in the 0th bit, the gradation of the pixel 110 can be controlled by light emission or non-light emission of the first LED chip 120 and the second LED chip 130 by turning the first pulse width on or off. A second pulse width is assigned for the other of the two bits (hereinafter referred to as "1st bit"). That is, in the 1st bit, the gradation of the pixel 110 is controlled by light emission or non-light emission of the first LED chip 120 and the second LED chip 130 by turning the second pulse width on or off. Here, the second pulse width is larger than the first pulse width. Therefore, the light emission time of the first LED chip 120 and the second LED chip 130 in the 1st bit is longer than the light emission time of the first LED chip 120 and the second LED chip 130 in the 0th bit. Therefore, in the PWM control method, four gradation levels as shown in Table 2 can be expressed by controlling light emission or non-light emission of the first LED chip 120 and the second LED chip 130 using the first pulse width or the second pulse width.

TABLE 2

| Gradation level | 0th bit | 1st bit |
| --- | --- | --- |
| 0 | First pulse width (turn off) | Second pulse width (turn off) |
| 1 | First pulse width (turn on) | Second pulse width (turn off) |
| 2 | First pulse width (turn off) | Second pulse width (turn on) |
| 3 | First pulse width (turn on) | Second pulse width (turn on) |

In the PWM control method, the voltage applied to the video signal SL(m) is constant, and the light emission time of the first LED chip 120 and the second LED chip 130 can be controlled by the pulse width of the signal supplied to the light emission control signal BG(n) connected to the gate electrode of the light emission control transistor BCT.

In the PWM control method, the number of gradations can be increased by increasing the number of pulse widths.

[5-3. Current Control Method]

In the current control method, the gradation of pixels is controlled by a current value supplied to the LED chip. That is, in the display device 10, the gradation of the pixel 110 is controlled by the current value supplied to the first LED chip 120 and the second LED chip 130. For convenience, the following description assumes that the number of gradations is 2 bits.

A first current value is assigned for one of the two bits (hereinafter referred to as "0th bit"). That is, in the 0th bit, the gradation of the pixel 110 can be controlled by light emission or non-light emission of the first LED chip 120 and the second LED chip 130 by turning the first current value on or off. A second current value is assigned for the other of the two bits (hereinafter referred to as "1st bit"). That is, in the 1st bit, the gradation of the pixel 110 is controlled by light emission or non-light emission of the first LED chip 120 and the second LED chip 130 by turning the second current value on or off. Here, the second current value is larger than the first current value. Therefore, the emission brightness of the first LED chip 120 and the second LED chip 130 in the 1st bit is higher than the emission brightness of the first LED chip 120 and the second LED chip 130 in the 0th bit. Therefore, in the current control method, four gradation levels as shown in Table 3 can be expressed by controlling light emission or non-light emission of the first LED chip 120 and the second LED chip 130 by the first current value or the second current value.

TABLE 3

| Gradation level | 0th bit | first bit |
|---|---|---|
| 0 | First current value (turn off) | Second current value (turn off) |
| 1 | First current value (turn on) | Second current value (turn off) |
| 2 | First current value (turn off) | Second current value (turn on) |
| 3 | First current value (turn on) | Second current value (turn on) |

In the current control method, the current value supplied to the first LED chip 120 and the second LED chip 130 can be controlled by changing the voltage applied to the video signal SL(m).

In the current control method, the number of gradations can be increased by increasing the number of current values.

Next, several gradation control modes selected for controlling the gradation of the pixels 110 of the display device 10 according to the present embodiment is described. The gradation control mode may be selected according to the illuminance of the external light, for example. For convenience, the following description assumes that the number of gradations is 6 bits.

[5-4. First Gradation Control Mode]

Figure 5:
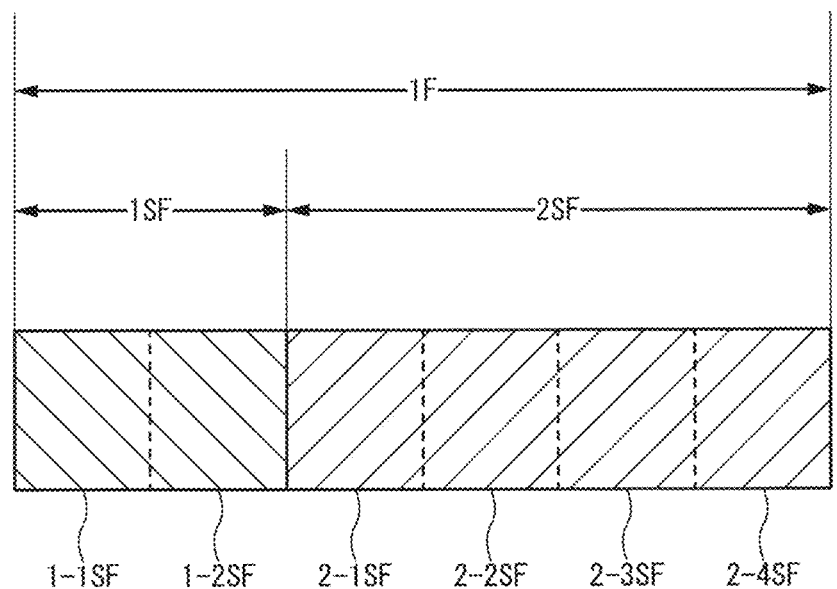
FIG. 5 is a schematic diagram illustrating gradation control of a pixel in one frame period using a first gradation control mode in a display device according to an embodiment of the present invention.

FIG. 5 is a schematic diagram illustrating gradation control of the pixel 110 in one frame period using a first gradation control mode in the display device according to an embodiment of the present invention.

In the first gradation control mode, one frame period (1F) is divided into a first subframe period (1SF) and a second subframe period (2SF). In the first subframe period (1SF), the gradation of the pixel 110 is controlled by the area control method. In the second subframe period (2SF), the gradation of the pixel 110 is controlled by the PWM control method. Each of the first subframe period (1SF) and the second subframe period (2SF) may be divided into a plurality of periods according to the number of gradations in the area control method and the PWM control method. In the first gradation control mode, the area control method is assigned for 2 bits of the 6-bit gradation number, and the PWM control method is assigned for 4 bits of the 6-bit gradation number. Therefore, in the first period (1-1SF) and the second period (1-2SF) of the first subframe period (1SF), the gradation of the pixel 110 is controlled depending on whether the first LED chip 120 or the second LED chip 130 emits light or not. Further, in the third period (2-1SF), the fourth period (2-2SF), the fifth period (2-3SF), and the sixth period (2-4SF) of the second subframe period (2SF), the gradation of the pixel 110 is controlled by the first pulse width, the second pulse width, the third pulse width, and the fourth pulse width (Here, the first pulse width>second pulse width>third pulse width>fourth pulse width). Therefore, the gradation control of the pixel 110 in each period (1-1SF to 2-4SF) in one frame period (1F) in the first gradation control mode is summarized as shown in Table 4.

TABLE 4

| First period (1-1SF) | Area control method | First LED chip |
|---|---|---|
| Second period (1-2SF) | Area control method | First LED chip and Second LED chip |
| Third period (2-1SF) | PWM control method | First pulse width |
| Fourth period (2-2SF) | PWM control method | Second pulse width |
| Fifth period (2-3SF) | PWM control method | Third pulse width |
| Sixth period (2-4SF) | PWM control method | Fourth pulse width |

In the first gradation control mode, the number of gradations controlled by the PWM control method is large. The PWM control method has the feature that the shift of the emission wavelength of the LED chip is small. Therefore, the control of the pixels 110 in the first gradation control mode is effective when the illuminance of the external light is low, where the shift in the emission wavelength is important. Therefore, for example, when the illuminance of the external light is less than or equal to 500 lux, the first gradation control mode is selected by the gradation control circuit 300.

In addition, the length of each period (1-1SF to 2-4SF) in one frame period (1F) may be the same or different.

[5-5. Second Gradation Control Mode]

Figure 6:
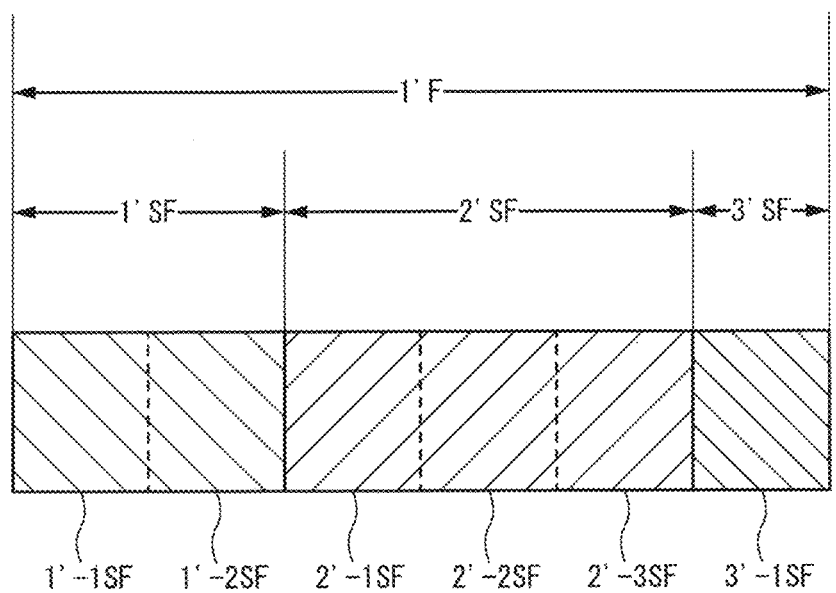
FIG. 6 is a schematic diagram illustrating gradation control of a pixel in one frame period using a second gradation control mode in a display device according to an embodiment of the present invention.

FIG. 6 is a schematic diagram illustrating gradation control of the pixel 110 in one frame period using a second gradation control mode in the display device 10 according to an embodiment of the present invention.

In the second gradation control mode, one frame period (1'F) is divided into a first subframe period (1'SF), a second subframe period (2'SF), and a third subframe period. (3'SF). In the first subframe period (1'SF), the gradation of the pixel 110 is controlled by the area control method. In the second subframe period (2'SF), the gradation of the pixel 110 is controlled by the PWM control method. In the third subframe period (3'SF), the gradation of the pixel 110 is controlled by the current control method. The first subframe period (1'SF), the second subframe period (2'SF), and the third subframe period (3'SF) may be respectively divided into a plurality of periods according to the number of gradations in the area control method, the PWM control method, and the current control method. In the second gradation control mode, the area control method is assigned for 2 bits of the 6-bit gradation number, the PWM control method is assigned for 3 bits of the 6-bit gradation number, and the current control method is assigned for 1 bit of the 6-bit gradation number. Therefore, in the first period (1'-1SF) and the second period (1-25F) of the first subframe period (1'SF), the gradation of the pixel 110 is controlled depending on whether the first LED chip 120 or the second LED chip 130 emits light or not. Further, in the third period (2'-1SF), the fourth period (2'-2SF), and the fifth period (2'-3SF) of the second subframe period (2'SF), the gradation of the pixel 110 is controlled by the fifth pulse width, the sixth pulse width, and the seventh pulse width (Here, the fifth pulse width>sixth pulse width>seventh pulse width. In addition, the pulse width in the second gradation control mode may be the same as the pulse width in the first gradation control mode. For example, the sixth pulse width and the seventh pulse width in the second gradation control mode may be the first pulse width and the second pulse width in the first gradation control mode, respectively). Furthermore, in the sixth period (3'-1SF) of the third subframe period (3'SF), the gradation of the pixel 110 is controlled by the first current value. Therefore, the gradation control of the pixel 110 in each period (1'-1SF to 3'-1SF) in one frame period (1'F) in the second gradation control mode is summarized as shown in Table 5.

TABLE 5

| First period (1'-1SF) | Area control method | first LED chip |
| --- | --- | --- |
| Second period (1'-2SF) | Area control method | First LED chip and Second LED chip |
| Third period (2'-1SF) | PWM control method | Fifth pulse width |
| Fourth period (2'-2SF) | PWM control method | Sixth pulse width |
| Fifth period (2'-3SF) | PWM control method | Seventh pulse width |
| Sixth period (3'-1SF) | Current control method | First current value |

In the second gradation control mode, the gradation of the pixel 110 can be controlled not only by the digital gradation control method such as the area control method and the PWM control method, but also by the analog gradation control method such as the current control method. Therefore, the control of the pixels 110 in the second gradation control mode is effective when the illuminance of the external light where high emission brightness is required while the shift in the emission wavelength is important. Therefore, for example, when the external light illuminance is greater than 500 lux and is less than or equal to 5000 lux, the second gradation control mode is selected by the gradation control circuit 300.

In addition, the length of each period (1'-1SF to 3'-1SF) in one frame period (1'F) may be the same or different.

[5-6. Third Gradation Control Mode]

Figure 7:
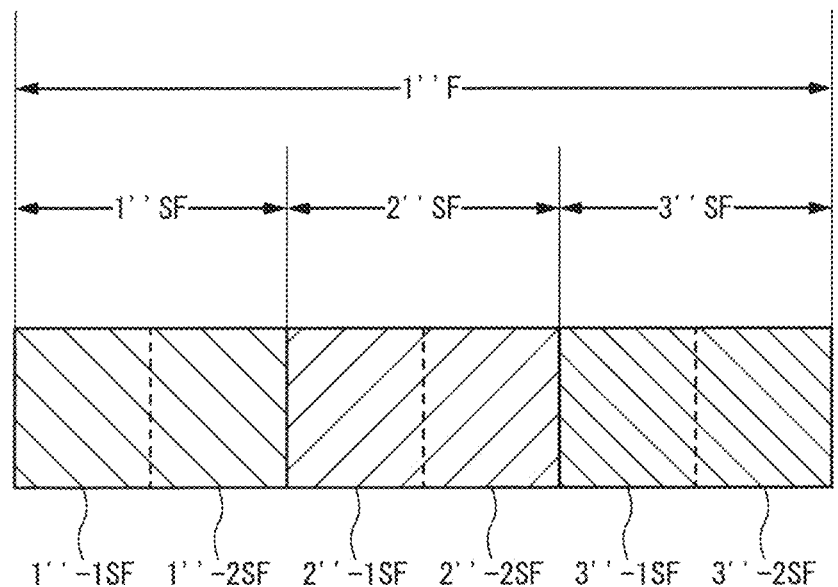
FIG. 7 is a schematic diagram illustrating gradation control of a pixel in one frame period using a third gradation control mode in a display device according to an embodiment of the present invention.

FIG. 7 is a schematic diagram illustrating gradation control of the pixel 110 in one frame period using a third gradation control mode in the display device 10 according to an embodiment of the present invention.

In the third gradation control mode, one frame period (1"F) is divided into a first subframe period (1"SF), a second subframe period (2"SF), and a third subframe period (3"SF). In the first subframe period (1"SF), the gradation of the pixel 110 is controlled by the area control method. In the second subframe period (2"SF), the gradation of the pixel 110 is controlled by the PWM control method. In the third subframe period (3"SF), the gradation of the pixel 110 is controlled by the current control method. The first subframe period (1"SF), the second subframe period (2"SF), and the third subframe period (3"SF) may be respectively divided into a plurality of periods according to the number of gradations in the area control method, the PWM control method, and the current control method. In the third gradation control mode, the area control method is assigned for 2 bits of the 6-bit gradation number, the PWM control method is assigned for 2 bits of the 6-bit gradation number, and the current control method is assigned for 2 bits of the 6-bit gradation number. Therefore, in the first period (1"-1SF) and the second period (1"-2SF) of the first subframe period (1"SF), the gradation of the pixel 110 is controlled depending on whether the first LED chip 120 or the second LED chip 130 emits light or not. Further, in the third period (2"-1SF) and the fourth period (2"-2SF) of the second subframe period (2"SF), the gradation of the pixel 110 is controlled by the eighth pulse width and the ninth pulse width (Here, the eighth pulse width>the ninth pulse width. In addition, the pulse width in the third gradation control mode is the same as the pulse width in the first gradation control mode or the second control mode. For example, the ninth pulse width in the third gradation control mode may be the same as the fifth pulse width in the second gradation control mode). Furthermore, in the fifth period (3"-1SF) and the sixth period (3"-2SF) of the third subframe period (3"SF), the gradation of the pixel 110 is controlled by the second current value and the third current value. Therefore, the gradation control of the pixel 110 in each period (1"-1SF to 3"-2SF) in one frame period (1"F) in the third gradation control mode is summarized as shown in Table 6.

TABLE 6

| First period (1"-1SF) | Area control method | First LED chip |
| --- | --- | --- |
| Second period (1"'-2SF) | Area control method | First LED chip and Second LED chip |
| Third period (2"-1SF) | PWM control method | Eighth pulse width |
| Fourth period (2"-2SF) | PWM control method | Ninth pulse width |
| Fifth period (3"-1SF) | Current control method | Second current value |
| Sixth period (3"-2SF) | Current control method | Third current value |

In the third gradation control mode, since the gradation of the pixel 110 can be controlled by the analog gradation control method such as the current control method, it has the feature that the emission brightness can be increased. Therefore, the control of the pixels 110 in the third gradation control mode is effective when the illuminance of the external light is high, where the magnitude of the emission brightness is important. Therefore, for example, when the illuminance of the external light illuminance is greater than 5000 lux, the third gradation control mode is selected by the gradation control circuit 300.

In addition, the length of each period (1"-1SF to 3"-2SF) in one frame period (1"F) may be the same or different.

Next, selection processing of a grayscale control mode executed by the gradation control circuit unit 300 of the display device 10 according to the present embodiment is described. The following description assumes that the gradation control circuit 300 selects any one of the above-described first to third gradation control modes.

[5-7. Selection Processing of Gradation Control Mode]

Figure 8:
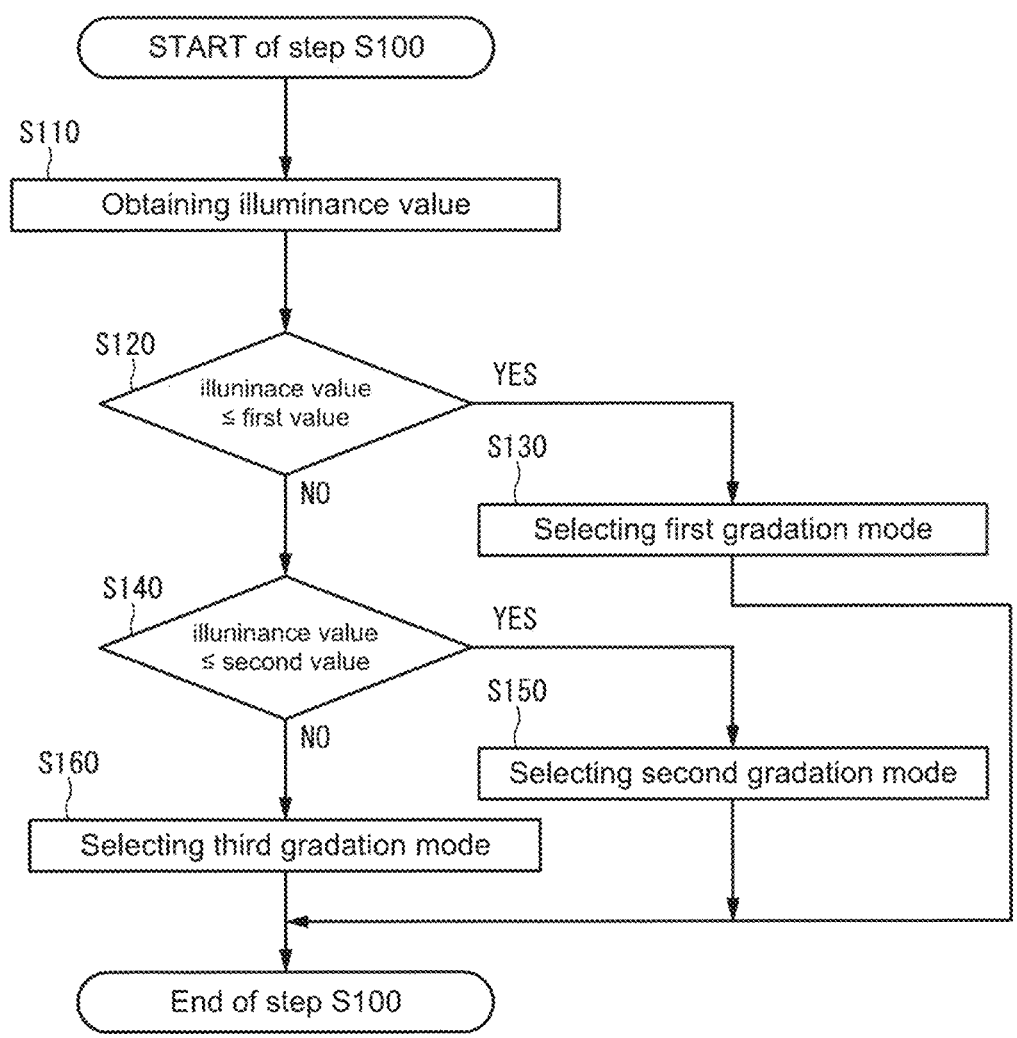
FIG. 8 is a flow chart showing selection processing of a gradation control mode executed by a gradation control circuit of a display device according to an embodiment of the present invention.

FIG. 8 is a flow chart showing a selection processing of a gradation control mode (step S100) executed by the gradation control circuit 300 of the display device 10 according to an embodiment of the present invention.

First, the gradation control circuit 300 obtains the illuminance value of the external light generated by the illuminance detection portion 200 (step S110). Next, the gradation control circuit unit 300 determines whether or not the obtained illuminance value is less than or equal to the first value (step S120). When the illuminance value is less than or equal to the first value (step S120: YES), the gradation control circuit 300 selects the first gradation control mode (step S130). When the first gradation control mode is selected, step S100 ends.

When the illuminance value is greater than the first value (step S120: NO), the gradation control circuit 300 determines whether or not the illuminance value is less than or equal to the second value (step S140). When the illuminance value is less than or equal to the second value (step S140: YES), the gradation control circuit 300 selects the second gradation control mode (step S150). When the second gradation control mode is selected, step S100 ends.

When the illuminance value is greater than the second value (step S140: NO), the gradation control circuit 300 selects the third gradation control mode (step S160). When the third gradation control mode is selected, step S100 ends.

The gradation control circuit 300 generates a signal for controlling the gradation of the pixel 110 according to the selected first to third gradation control modes.

For example, the first value is 500 lux. Further, for example, the second value is 5000 lux. However, the first value and the second value are not limited to these values.

In the display device 10 according to the present embodiment, the gradation control mode is selected by the gradation control circuit 300. Although the image quality required for display on the display area 100 varies depending on the illuminance value of the external light, the gradation of the pixel 110 can be controlled according to the illuminance value. Therefore, the display area 100 of the display device 10 can display with excellent visibility.

Second Embodiment

The first LED chip 120 and the second LED chip 130 of the display device 10 are not limited to the same LED chip. Therefore, in the present embodiment, a first LED chip 120A and a second LED chip 130A having the same size but different element structures is described with reference to FIG. 9. In addition, hereinafter, when the configuration of the present embodiment is the same as the configuration of the above-described First Embodiment, the description of the configuration of the present embodiment may be omitted.

Figure 9:
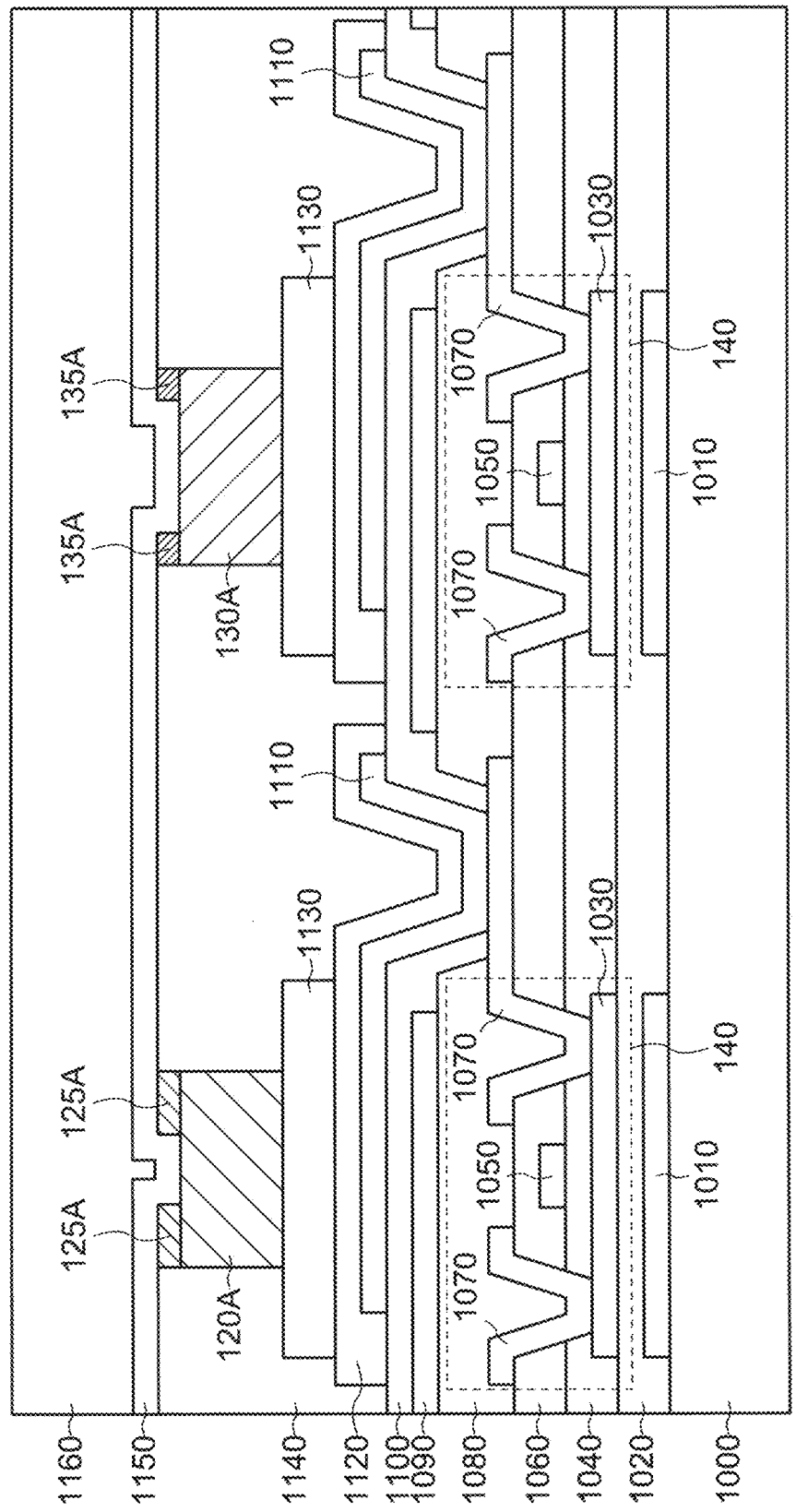
FIG. 9 is a schematic cross-sectional view of a pixel of a display device according to an embodiment of the present invention.

FIG. 9 is a schematic cross-sectional view of a pixel 110A of the display device 10 according to an embodiment of the present invention.

As shown in FIG. 9, the pixel 110A includes a first LED chip 120A and a second LED chip 130A. A first resistive film 125A and a second resistive film 135A are provided on the first LED chip 120A and the second LED chip 130A, respectively. The area where the first resistive film 125A contacts the first LED chip 120A is larger than the area where the second resistive film 135A contacts the second LED chip 130A. Therefore, the amount of charge injected into the first LED chip 120A is smaller than the amount of charge injected into the second LED chip 130A. That is, when the same voltage is applied to the first LED chip 120A and the second LED chip 130, the current value supplied to the first LED chip 120A is less than the current value supplied to the second LED chip 130A.

In the present embodiment, the difference in the current values supplied to the first LED chip 120A and the second LED chip can be used. For example, in the area control method, the gradation of pixel 110 may be controlled by light emission or non-light emission of each of the first LED chip 120A and second LED chip 130A. For convenience, the following description assumes that the number of gradations is 2 bits.

Light emission control of the first LED chip 120A is assigned for one of the two bits (hereinafter referred to as "0th bit"). That is, in the 0bit, the gradation of the pixel 110 can be controlled depending on whether the first LED chip 120A emits light or not. Light emission control of the second LED 130A is assigned for the other of the two bits (hereinafter referred to as "1st bit"). That is, in the 1st bit, the gradation of the pixel 110 can be controlled depending on whether the second LED chip 130A emits light or not. The light emitting area of the second LED chip 130A controlled by the 1st bit is larger than the light emitting area of the first LED chip 120A controlled by the 0th bit. Therefore, in the area control method of the present embodiment, four gradation levels as shown in Table 7 can be expressed by controlling light emission or non-light emission of each of the first LED chip 120A and the second LED chip 130A.

TABLE 7

| Gradation level | 0th bit | 1st bit |
|---|---|---|
| 0 | First LED chip (non-light emission) | Second LED chip (non-light emission) |
| 1 | First LED chip (light emission) | Second LED chip (non-light emission) |
| 2 | First LED chip (non-light emission) | Second LED chip (light emission) |
| 3 | First LED chip (light emission) | Second LED chip (light emission) |

In addition, the number of gradations can be increased by increasing the number of LED chips in the area control method of the present embodiment.

Since the first LED chip 120A and the second LED chip 130A of the present embodiment have the same size, the first LED chip 120A and the second LED chip 130A can be transferred by the same method. Therefore, the display device 10 can be manufactured without changing the manufacturing method. Further, since each of the first LED chip 120A and the second LED chip 130A is assigned to a bit of the number of gradations in the area control method, the frequency of light emission is not biased to either one of the first LED chip 120A and the second LED chip 130A. Therefore, since the first LED chip 120A and the second LED chip 130A deteriorate in substantially the same manner, variations in display on the display area 100 can be reduced.

Third Embodiment

The selection processing of a gradation control mode by the grayscale control circuit 300 of the display device 10 is not limited to the selection processing described in First Embodiment. Therefore, in the present embodiment, another selection processing of a gradation control mode executed by the gradation control circuit 300 of the display device 10 is described with reference to FIGS. 10 and 11. In addition, hereinafter, when the configuration of the present embodiment is the same as the configuration of the above-described First Embodiment, the description of the configuration of the present embodiment may be omitted.

Figure 10:
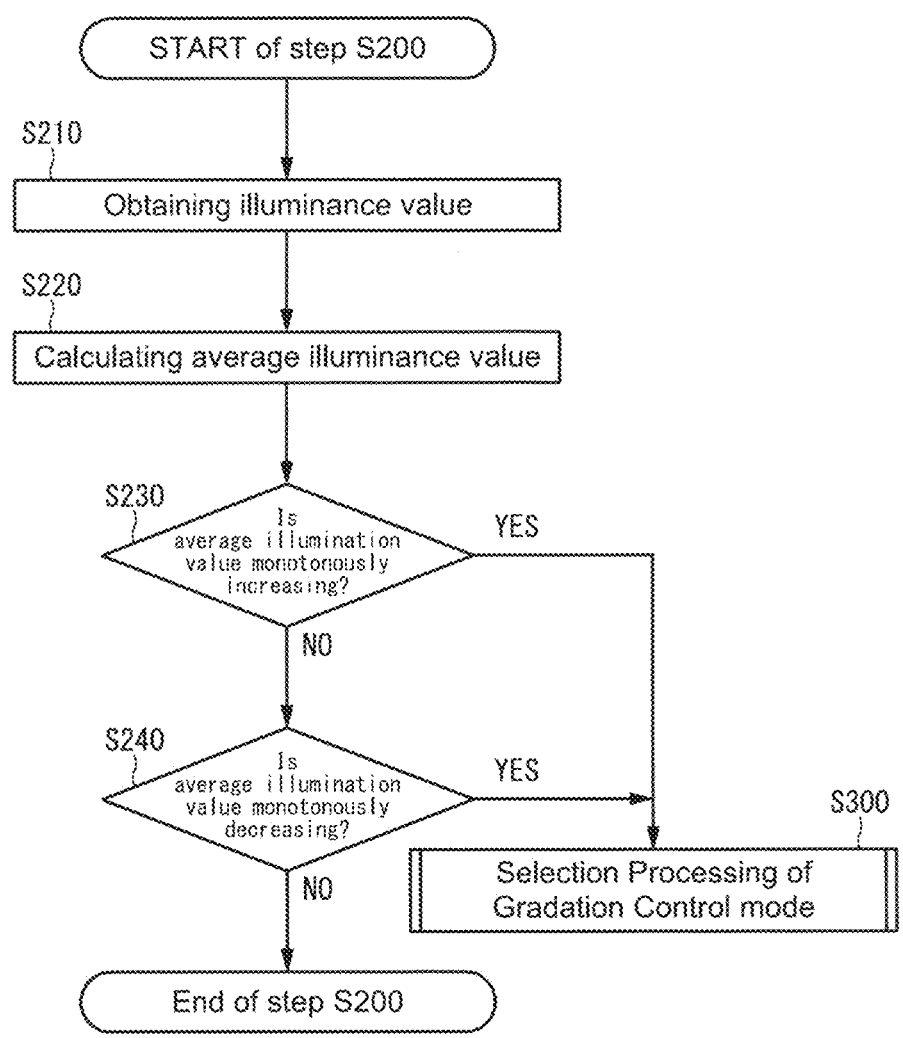
FIG. 10 is a flow chart showing average illuminance value calculation processing executed by a gradation control circuit of a display device according to an embodiment of the present invention.
Figure 11:
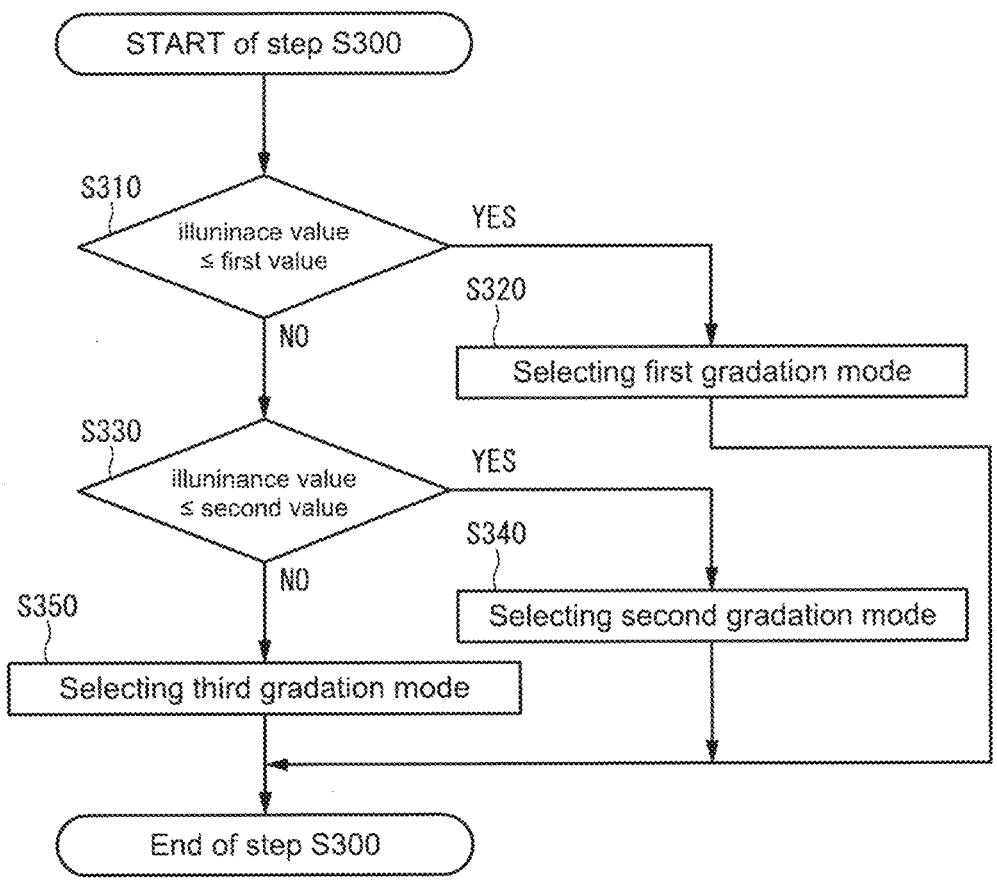
FIG. 11 is a flow chart showing selection processing of a gradation control mode executed by a gradation control circuit of a display device according to an embodiment of the present invention.

FIG. 10 is a flow chart showing average illuminance value calculation processing (step S200) executed by the gradation control circuit of the display device 10 according to an embodiment of the present invention. FIG. 11 is a flow chart showing selection processing of a gradation control mode (step S300) executed by the gradation control circuit of the display device according to an embodiment of the present invention.

First, the gradation control circuit 300 obtains the illuminance value of the external light generated by the illuminance detection portion 200 (step S210). Next, the gradation control circuit unit 300 calculates an average illuminance value $L_{ave\_n}$ of the illuminance values of the first to n-th frames (n is an integer greater than or equal to 2) (step S220). Next, the gradation control circuit 300 determines whether or not the average illuminance value $L_{ave\_n}$ is monotonically increasing (step S230). For example, when the average illuminance value $L_{ave\_n}$ in the nth frame is greater than the average illuminance value $L_{ave\_n-1}$ in the n−1-th frame, it can be determined that the average illumination value is monotonously increasing. Further, in the case where n is 3 or more, when the average illuminance value $L_{ave\_n}$ in the n-th frame is greater than the average illuminance value $L_{ave\_n-1}$ in the n−1-th frame and the average illuminance value $L_{ave\_n-1}$ is greater than the average illuminance value $L_{ave\_n-2}$ in the n−2-th frame, it may be determined that the average illuminance value is monotonously increasing.

When the average illuminance value $L_{ave\_n}$ is monotonically increasing (step S230: YES), the selection processing of a gradation control mode is executed (step S300).

When the average illuminance value $L_{ave\_n}$ is not monotonically increasing (step S230: NO), the gradation control circuit unit 300 determines whether the average illuminance value $L_{ave\_n}$ is monotonously decreasing (step S240). For example, when the average illuminance value $L_{ave\_n}$ in the n-th frame is less than the average illuminance value $L_{ave\_n-1}$ in the n−1-th frame, it can be determined that the average illumination is monotonously decreasing. Further, in the case where n is 3 or more, when the average illuminance value $L_{ave\_n}$ in the n-th frame is less than the average illuminance value $L_{ave\_n-1}$ in the n−1-th frame and the average illuminance value $L_{ave\_n-1}$ is less than the average illuminance value $L_{ave\_n-2}$ in the n−2-th frame, it may be determined that the average illuminance value is monotonously decreasing.

When the average illuminance value $L_{ave\_n}$ is monotonically decreasing (step S240: YES), the selection processing of a gradation control mode is executed (step S300).

When the average illuminance value $L_{ave\_n}$ is not monotonously decreasing (step S240: NO), step S200 ends. In this case, the selection processing of a gradation control mode is not executed. That is, control of the gradation of the pixel 110 is executed using the current gradation control mode.

Next, the selection processing of a gradation control mode selection (step S300) is described.

The gradation control circuit unit 300 determines whether or not the calculated average illuminance value $L_{ave\_n}$ is less than or equal to the first value (step S310). When the average illuminance value $L_{ave\_n}$ is less than or equal to the first value (step S310: YES), the gradation control circuit 300 selects the first gradation control mode (step S320). When the first gradation control mode is selected, step S300 ends.

When the average illuminance value $L_{ave\_n}$ is greater than the first value (step S310: NO), the gradation control circuit unit 300 determines whether or not the average illuminance value $L_{ave\_n}$ is less than or equal to the second value (step S330). When the average illuminance value $L_{ave\_n}$ is less than or equal to the second value (step S330: YES), the gradation control circuit 300 selects the second gradation control mode (step S340). When the second gradation control mode is selected, step S300 ends.

When the average illuminance value $L_{ave\_n}$ is greater than the second value (step S330: NO), the gradation control circuit 300 selects the third gradation control mode (step S350). When the third gradation control mode is selected, step S300 ends.

The gradation control circuit 300 generates a signal for controlling the gradation of the pixel 110 according to the selected first to third gradation control modes.

For example, the first value is 500 lux. Further, for example, the second value is 5000 lux. However, the first value and the second value are not limited to these values.

In the selection processing of a gradation control mode of the present embodiment, the illuminance values obtained in a plurality of frames are averaged and the average illuminance value is determined to select the gradation control mode. Thus, the gradation control mode is not switched in response to the noise of the external light (a sudden change of the external light). Therefore, it is possible to smoothly switch the gradation control mode.

Each of the embodiments described above as an embodiment of the present invention can be appropriately combined and implemented as long as they do not contradict each other. Additions, deletions, or design changes of constituent elements, or additions, omissions, or changes to conditions of steps as appropriate based on the respective embodiments are also included within the scope of the present invention as long as the gist of the present invention is provided.

Other effects which differ from those brought about by each of the embodiments described above, but which are apparent from the description herein or which can be readily predicted by those skilled in the art, are naturally understood to be brought about by the present invention.

What is claimed is:

1. A display device comprising:
    a display area comprising a pixel;
    an illuminance detection portion configured to detect an illuminance value of an external light; and
    a gradation control circuit configured to select one of a first gradation control mode, a second gradation control mode, and a third gradation control mode based on the illuminance value,
    wherein the pixel comprises a first LED chip and a second LED chip,
    one frame period of the first gradation control mode comprises a first subframe period and a second subframe period,
    one frame period of the second gradation control mode comprises a third subframe period, a fourth subframe period, and a fifth subframe period,
    one frame period of the third gradation control mode comprises a sixth subframe period, a seventh subframe period, and an eighth subframe period,
    a gradation of the pixel is controlled by a light emitting area of each of the first LED chip and the second LED chip in the first subframe period, the third subframe period, and the sixth subframe period,
    the gradation of the pixel is controlled by a light emission time of each of the first LED chip and the second LED chip in the second subframe period, the fourth subframe period, and the seventh subframe period, and
    the gradation of the pixel is controlled by a current value supplied to each of the first LED chip and the second LED chip in the fifth subframe period and the eighth subframe period.

2. The display device according to claim 1, wherein the first gradation control mode is selected when the illuminance value is less than or equal to a first value.

3. The display device according to claim 2, wherein the first value is 500 lux.

4. The display device according to claim 2, wherein the second gradation control mode is selected when the illuminance value is greater than the first value and less than or equal to a second value.

5. The display device according to claim 4, wherein the second value is 5000 lux.

6. The display device according to claim 4, wherein the third gradation control mode is selected when the illuminance value is greater than the second value.

7. The display device according to claim 1, wherein a number of graduations controlled in the fourth subframe period is greater than a number of graduations controlled in the fifth subframe period.

8. The display device according to claim 1, wherein a number of graduations controlled in the eighth subframe period is greater than a number of graduations controlled in the fifth subframe period.

9. The display device according to claim 1, wherein the graduation control circuit selects one of the first gradation control mode, the second gradation control mode, and the third gradation control mode based on an average illuminance value obtained by averaging the illuminance values in first to n-th frames (n is an integer greater than or equal to 2).

10. The display device according to claim 1, wherein the first LED chip and the second LED chip are identical.

11. The display device according to claim 10,
wherein a number of graduations controlled in each of the first subframe period, the third subframe period, and the sixth subframe period is 2 bits,
the graduation of the pixel by one of the 2 bits is controlled by light emission or non-light emission of the first LED chip, and
the graduation of the pixel by the other of the 2 bits is controlled by light emission or non-light emission of the second LED chip.

12. The display device according to claim 1, wherein the first LED chip and the second LED chip have different sizes.

13. The display device according to claim 1, wherein the first LED chip and the second LED chip have different light emitting areas.

* * * * *